United States Patent [19]
Pace

[11] 4,134,030
[45] Jan. 9, 1979

[54] HALL-EFFECT INTEGRATED CIRCUIT SWITCH

[75] Inventor: Wilson D. Pace, Tempe, Ariz.
[73] Assignee: Motorola, Inc., Schaumburg, Ill.
[21] Appl. No.: 899,127
[22] Filed: Apr. 24, 1978

Related U.S. Application Data

[63] Continuation of Ser. No. 756,570, Jan. 3, 1977, abandoned.

[51] Int. Cl.² ............................................. H03K 17/00
[52] U.S. Cl. ....................................... 307/309; 307/310; 330/6
[58] Field of Search ................... 307/309, 310; 330/6; 324/45, 117

[56] References Cited
U.S. PATENT DOCUMENTS

| | | | |
|---|---|---|---|
| 3,573,495 | 4/1971 | Xylander | 307/310 |
| 3,613,021 | 10/1971 | Scheidt | 330/6 |
| 3,816,766 | 6/1974 | Anselmo et al. | 307/309 |

OTHER PUBLICATIONS

IBM Tech. Dsclre. Bttn., Hall Tranducer Circuit With Voltage and Current Regulation, by Braun et al., vol. 17, No. 11, 4/1975, p. 3232.

*Primary Examiner*—John S. Heyman
*Assistant Examiner*—B. P. Davis
*Attorney, Agent, or Firm*—Marvin A. Glazer

[57] ABSTRACT

An integrated circuit in which the Hall-Effect device and the sensing circuit can be incorporated on a single monolithic chip includes a Hall-Effect generator responsive to a magnetic flux change for generating a Hall-Effect voltage. A differential amplifier and current mirror circuit are coupled to the Hall-Effect device in order to vary or track the threshold voltage of the differential amplifier circuit in accordance with the output voltage from the Hall-Effect device irrespective of current changes in the Hall-Effect device due to temperature variations.

5 Claims, 3 Drawing Figures

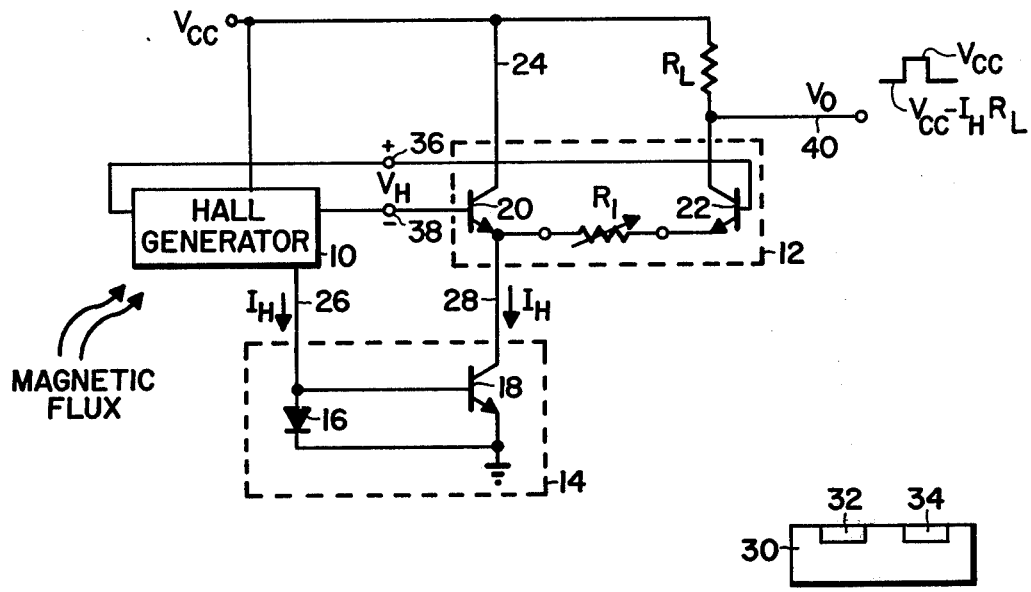
FIG. 1
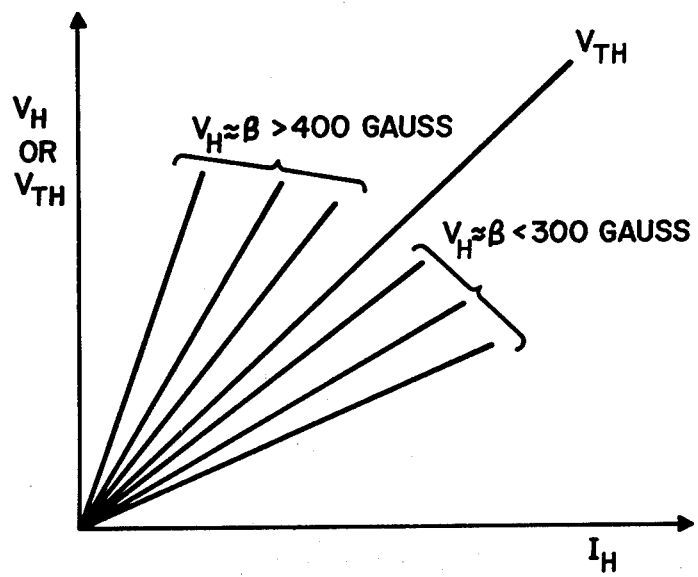
FIG. 3
FIG. 2

HALL-EFFECT INTEGRATED CIRCUIT SWITCH

This is a continuation, of application Ser. No. 756,570, filed Jan. 3, 1977 now abandoned.

BACKGROUND OF THE INVENTION

A Hall-Effect device is a block of semiconductor material which acts as a transducer to convert magnetic flux density into an electrical potential. When a current is passed from one end of the semiconductor material to the other, hole electron pairs are formed inside the semiconductor material. A magnetic field perpendicular to the flow of the current will cause the holes and electrons to separate producing a voltage potential which can be measured between the opposite sides of the semiconductor material. This voltage is proportional to the flux density of the magnetic field and the magnitude of the current flowing through the Hall-Effect device and is mathematically represented by:

$V_H = K1 I_H \beta$, where $K$ = device constant; $I_H$ = Hall current; and $\beta$ = magnetic flux density.

Since the Hall-Effect device is made of semiconductor material, a constant voltage applied across the device will produce a current through the Hall-Effect device which varies exponentially with temperature. As a result the accuracy of the Hall-Effect transducer is impaired.

In the past one solution attempted to avoid this problem by employing a constant current generator. However, certain problems arose with this approach. Firstly, an ideal constant current source is difficult to build with integrated circuit devices since they contain nonlinear monolithic resistors. A further problem is that there is a temperature dependence associated with the epitaxial silicon Hall resistance despite the use of constant current regulation. A detailed discussion of this latter phenomenon is described in the article entitled "Modular Hall Masterslice Transducer" by R. J. Braun appearing in the IBM Journal Research and Development, July, 1975.

SUMMARY OF THE INVENTION

The present invention takes a different approach for Hall-Effect devices in applications where a threshold voltage is to be detected. No constant current sources are required, but rather a differential sensing device is coupled to the Hall-Effect device and it samples the current flowing through the device and adjusts the threshold voltage of the sensing circuit to compensate for any change in Hall-Effect current due to temperature variations. Thus, the Hall-Effect device and the sensing circuit are referenced together so that both the voltage produced by the Hall-Effect device and the voltage threshold of the comparator or sensing circuit are both a function of current flowing through the Hall-Effect device.

In typical automobile ignition systems an out of proximity magnetic rotor would have a flux density of less than 300 gauss, whereas a magnetic field density of 400 gauss or greater would indicate that the engine is in the proper position to fire a spark plug. In this application, a Hall generator device and sensing comparator initially would be set so that the comparator or sensing circuit would change states when the Hall voltage is 14 millivolts representing a magnetic flux density of 350 gauss. Thereafter, variations in temperature or supply voltage would cause the Hall-Effect current, and therefore the voltage generated by the Hall-Effect device, to change. The Hall current variations would also cause a corresponding change in the threshold of the comparator circuit such that the threshold will still switch at 350 gauss independent of the actual variations of the Hall-Effect current.

DESCRIPTION OF THE DRAWINGS

FIG. 1 illustrates an electrical schematic of the present invention.

FIG. 2 is a series of curves illustrating the Hall-Effect voltage and the threshold voltage of the comparator plotted against the Hall-Effect current.

FIG. 3 illustrates the present invention being incorporated on a single monolithic semiconductor chip.

DESCRIPTION OF THE PREFERRED EMBODIMENTS

Now referring to FIG. 1, it illustrates a Hall-Effect generator device 10 coupled to a differential sensing or comparator circuit 12. A conventional current mirror circuit 14 comprising a semiconductor diode 16 in one leg and an NPN transistor 18 in the other leg is coupled between the Hall generator 10 and the comparator or sensing circuit 12. The sensing circuit 12 comprises a pair of differentially connected transistors 20 and 22 coupled to supply voltage $V_{CC}$ by line 24 and load resistor $R_L$, respectively. A resistor R1 is commonly connected between the emitter terminals of transistors 20 and 22. Diode 16 is coupled to the Hall generator by line 26 and line 28 couples the collector terminal of transistor 18 to the emitter terminal of transistor 20.

In the preferred embodiment, the plot of FIG. 2 illustrates that for flux densities of less than 300 gauss the threshold voltage $V_{TH}$ of the sensing circuit 12 will not be reached by the Hall voltage $V_H$ while flux densities of greater than 400 gauss will generate a Hall voltage $V_H$ greater than the threshold voltage $V_{TH}$.

FIG. 3 illustrates a body of semiconductor material 30 having a Hall-Effect device 32 and an integrated circuit 34 formed in the body. In actual implementation Hall-Effect device 32 would correspond to the device 10 of FIG. 1 and integrated circuit 34 would correspond to the remainder of the circuitry.

OPERATION

The current mirror circuit 14 causes the value of current $I_H$ flowing in line 28 to equal the Hall-Effect current $I_H$ generated in line 26 connected to the Hall Effect device 10. Thus despite temperature variations the current in lines 26 and 28 will remain essentially the same.

At the threshold point of the comparator, identical collector and emitter currents are flowing in both of the differential transistors 20 and 22, i.e., $I_H/2$. Thus, the voltage across resistor R1 equals $I_H R1/2$. As a result, the base-emitter junction of transistor 22 is more positively biased than the base-emitter junction of transistor 20 thereby creating a voltage offset or threshold voltage $V_{TH} = \frac{1}{2} I_H R1 = K2 I_H$.

As previously set forth, the Hall voltage $V_H$ existing across terminals 36 and 38 is represented by: $V_H = K1 I_H \beta$. Accordingly, the point at which the sensing circuit 12 generates an output signal $V_O$ is substantially independent of Hall current $I_H$ since K1 and K2 are constants. Temperature induced current variations in the Hall device 10 are not capable of triggering a Hall sensing device at erroneous Hall voltage levels as the threshold voltage of the sensing circuit 12 tracks with Hall current changes.

What is claimed is:

1. A Hall-Effect integrated circuit comprising:
   (a) a Hall-Effect semiconductor device being responsive to a magnetic flux for providing a Hall-Effect output signal in response to the magnetic flux and having a Hall-Effect current flowing therethrough sensitive to temperature variations,
   (b) sensing means having a threshold voltage and an operating current coupled to said Hall-Effect device for generating an output voltage at a time when said output signal reaches said threshold voltage, and
   (c) means coupled to said Hall-Effect device and to said sensing means for maintaining said operating current at a value which has predetermined relationship to said Hall-Effect current during temperature variations for causing said Hall-Effect output signal to track with said threshold voltage for generating a sensing output signal substantially independent of temperature variations.

2. A Hall-Effect circuit as recited in claim 1 wherein:
   (a) said means coupled to said Hall-Effect device and to said sensing means is operatively coupled to said Hall-Effect device and is responsive to said Hall-Effect current for maintaining said operating current at a value which has a predetermined relationship to said Hall-Effect current during temperature variations for causing said Hall-Effect output signal to track with said threshold voltage for generating a sensing output signal substantially independent of temperature variations.

3. A Hall-Effect circuit as recited in claim 2 wherein:
   (a) said means coupled to said Hall-Effect device and to said sensing means comprises a first terminal and a second terminal, said first terminal being coupled to said Hall-Effect device for conducting said Hall-Effect current, and said second terminal being coupled to said sensing means for providing said operating current.

4. A Hall-Effect circuit as recited in claim 3 wherein:
   (a) said means coupled to said Hall-Effect device and to said sensing means comprises a current mirror circuit for maintaining said operating current at a value which has a predetermined relationship to said Hall-Effect current.

5. A Hall-Effect circuit as recited in claims 3 or 4 wherein:
   (a) said sensing means comprises a differential amplifier circuit having a pair of differentially coupled transistors.

* * * * *